US012684996B2

(12) United States Patent
Shin

(10) Patent No.: US 12,684,996 B2
(45) Date of Patent: Jul. 14, 2026

(54) ELECTROLUMINESCENT DISPLAY DEVICE

(71) Applicant: LG DISPLAY CO., LTD., Seoul (KR)

(72) Inventor: JooHwan Shin, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 419 days.

(21) Appl. No.: 18/238,113

(22) Filed: Aug. 25, 2023

(65) Prior Publication Data

US 2024/0099102 A1     Mar. 21, 2024

(30) Foreign Application Priority Data

Sep. 15, 2022     (KR) ......................... 10-2022-0116389

(51) Int. Cl.
H10K 59/80 (2023.01)
H10K 59/122 (2023.01)

(52) U.S. Cl.
CPC ......... H10K 59/873 (2023.02); H10K 59/122 (2023.02); H10K 59/80521 (2023.02); H10K 59/8722 (2023.02)

(58) Field of Classification Search
CPC ........... H10K 59/873; H10K 59/80521; H10K 59/122; H10K 59/8722
See application file for complete search history.

(56) References Cited

U.S. PATENT DOCUMENTS

| | | | |
|---|---|---|---|
| 2019/0326549 A1 | 10/2019 | Kokame et al. | |
| 2022/0149320 A1 | 5/2022 | Yang et al. | |
| 2022/0406861 A1* | 12/2022 | Yang ..................... | H10K 59/873 |
| 2023/0077098 A1* | 3/2023 | Kim ..................... | H10K 50/844 |

FOREIGN PATENT DOCUMENTS

| | | |
|---|---|---|
| JP | 2010-287421 A | 12/2010 |
| JP | 2016-042418 A | 3/2016 |
| JP | 2018-113104 A | 7/2018 |
| JP | 2022-070849 A | 5/2022 |
| KR | 10-2022-0056107 A | 5/2022 |
| KR | 10-2022-0061416 A | 5/2022 |

OTHER PUBLICATIONS

Office Action in Japanese Appln. No. 2023-146120, mailed on Jan. 14, 2025, 6 pages (with English translation).
Japanese Office Action dated Jul. 29, 2024 issued in Patent Application No. 2023-146120 w/English Translation (6 pages).
Korean Office Action dated Jan. 29, 2026 issued in Korean Patent Application No. 10-2022-0116389.

* cited by examiner

*Primary Examiner* — Anne M Hines
(74) *Attorney, Agent, or Firm* — PnK IP LLC

(57)     ABSTRACT

An electroluminescent display device according to an exemplary aspect of the present disclosure includes a substrate including an active area and a non-active area outside the active area, a planarization layer over the substrate and extending from the active area to the non-active area, a bank on a planarization layer extending to the non-active area, an organic layer on the bank, a cathode on the organic layer, a capping layer over the cathode, a trench pattern configured in the non-active area, from which the capping layer, the cathode, and the organic layer are removed and a step alleviation layer filling the trench pattern and planarizing an upper portion of the trench pattern, the capping layer adjacent to the trench pattern may be recessed inwardly compared to the cathode, so that a bezel width is reduced, and the same time, reliability of moisture permeation prevention performance may be improved.

23 Claims, 12 Drawing Sheets

| LASER WAVELENGTH (nm) | CAPPING LAYER | ORGANIC LAYER | CATHODE | TRIPLE LAYER |
|---|---|---|---|---|
| 1064 | 90.06% | 86.16% | 0% | 0% |
| 532 | 84.25% | 90.12% | 0% | 0.03% |
| 355 | 1.2% | 32.8% | 0% | 0% |

ELECTROLUMINESCENT DISPLAY DEVICE

CROSS-REFERENCE TO RELATED APPLICATIONS

This application claims the benefit of and priority to Korean Patent Application No. 10-2022-0116389 filed on Sep. 15, 2022, in the Republic of Korea, the entire contents of which are hereby expressly incorporated by reference into the present application.

BACKGROUND

Field of the Disclosure

The present disclosure relates to an electroluminescent display device, and more particularly, to an electroluminescent display device having a narrow bezel.

Description of the Background

As we move toward an information-oriented society, the field of display devices for visually expressing electrical information has rapidly advanced. Various display devices having improved performance in terms of thinness, lightness, and low power consumption, are being developed correspondingly.

Representative display devices include a liquid crystal display device (LCD), an electro-wetting display device (EWD), and an organic light emitting display device (OLED).

Among the display devices, electroluminescent display devices, including organic light emitting display devices, are self-luminous display devices and may be manufactured to be light and thin since such display devices do not require a separate light source, unlike liquid crystal display devices having a separate light source. In addition, electroluminescent display devices have advantages in terms of power consumption due to a low voltage driving, and have improved color implementation, response speed, viewing angle, and contrast ratio (CR). Therefore, electroluminescent display devices are being used in various applications.

SUMMARY

In current electroluminescent display devices, a minimum bezel distance is required to secure reliability such as moisture permeation prevention or the like, which may be referred to as a reliable bezel. The reliable bezel may be defined as being from an end portion of an upper substrate (an encapsulation substrate) to an end portion of a cathode.

Meanwhile, in response to demand for slimming of a display device, demand for slimming of a non-active area of the display device except for an active area in which an image is displayed is also increasing. However, there is a limit in securing a reliable bezel as a cathode needs to be formed to cover an organic layer to prevent defects in mass production due to exposure of the organic layer. That is, when the organic layer and the cathode are formed by deposition, a shadow area of a certain length is generated depending on a gap between a deposition mask and a substrate and a deposition method, thereby limiting a reduction of a bezel. In addition, a position and length of the shadow area are non-uniform due to process deviation, and non-uniform quality is caused due to a difference in reliable bezel for each product.

Accordingly, an object to be achieved by the exemplary aspect of the present disclosure is to provide an electroluminescent display device capable of having a bezel width by disposing a trench pattern in a shadow area and converting the shadow area into a reliable bezel area.

Another object to be achieved by the exemplary aspect of the present disclosure is to provide an electroluminescent display device having improved reliability by reducing lifting of a cathode adjacent to a trench pattern.

Still another object to be achieved by the exemplary aspect of the present disclosure is to provide an electroluminescent display device in which rigidity of a display panel is increased and a heat dissipation effect is improved.

Objects of the present disclosure are not limited to the above-mentioned objects, and other objects, which are not mentioned above, may be clearly understood by those skilled in the art from the following descriptions.

In one aspect, an electroluminescent display device includes a substrate including an active area and a non-active area outside the active area; a planarization layer over the substrate and extending from the active area to the non-active area; and a bank on the planarization layer extending to the non-active area. The electroluminescent display device further includes an organic layer on the bank; a cathode on the organic layer; a capping layer over the cathode; a trench pattern configured in the non-active area, from which the capping layer, the cathode, and the organic layer are removed; and a step alleviation layer filling the trench pattern and planarizing an upper portion of the trench pattern, wherein the capping layer adjacent to the trench pattern is recessed inwardly compared to the cathode.

In another aspect, the step alleviation layer is implemented as a film.

In another aspect, the step alleviation layer includes getters.

In another aspect, the cathode disposed outside the trench pattern covers a side surface of the organic layer.

In another aspect, the electroluminescent display device further includes an inorganic layer on the step alleviation layer.

In another aspect, the step alleviation layer is disposed in contact with a portion of an upper surface of the capping layer disposed outside the trench pattern.

In another aspect, the inorganic layer is disposed in contact with an upper surface and a side surface of the step alleviation layer, a portion of the upper surface of the capping layer, and a portion of an upper surface of the bank.

In another aspect, the inorganic layer is disposed in contact with a portion of an upper surface and a side surface of the bank and a portion of an upper surface of the planarization layer.

In another aspect, the step alleviation layer covers the capping layer and the cathode disposed outside the trench pattern, and is disposed in contact with a portion of an upper surface of the bank extending outwardly of the capping layer and the cathode.

In another aspect, the inorganic layer is disposed in contact with an upper surface and a side surface of the step alleviation layer and another portion of the upper surface of the bank.

In another aspect, the step alleviation layer covers the capping layer, the cathode, and the bank disposed outside the trench pattern, while contacting a portion of an upper surface of the planarization layer extending outwardly of the bank.

In another aspect, the inorganic layer is disposed in contact with an upper surface and a side surface of the step alleviation layer and another portion of the upper surface of the planarization layer.

In another aspect, the inorganic layer extends to the non-active area to expose a side surface thereof.

In another aspect, an end portion of the cathode disposed adjacent to the trench pattern has a shape that is lifted or rolled upward.

In another aspect, the end portion of the cathode is spaced apart from the organic layer.

In another aspect, the step alleviation layer fills a separation space between the cathode and the organic layer.

In another aspect, the electroluminescent display device further includes reinforcement substrate and a sealing member having a multilayer structure, disposed on the inorganic layer.

In another aspect, the sealing member includes a first adhesive layer on the step alleviation layer and facing the substrate; a second adhesive layer facing the reinforcement substrate; and a barrier layer between the first adhesive layer and the second adhesive layer.

In another aspect, the inorganic layer extends to ends of the sealing member and the reinforcement substrate.

In another aspect, a side surface of the inorganic layer is exposed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
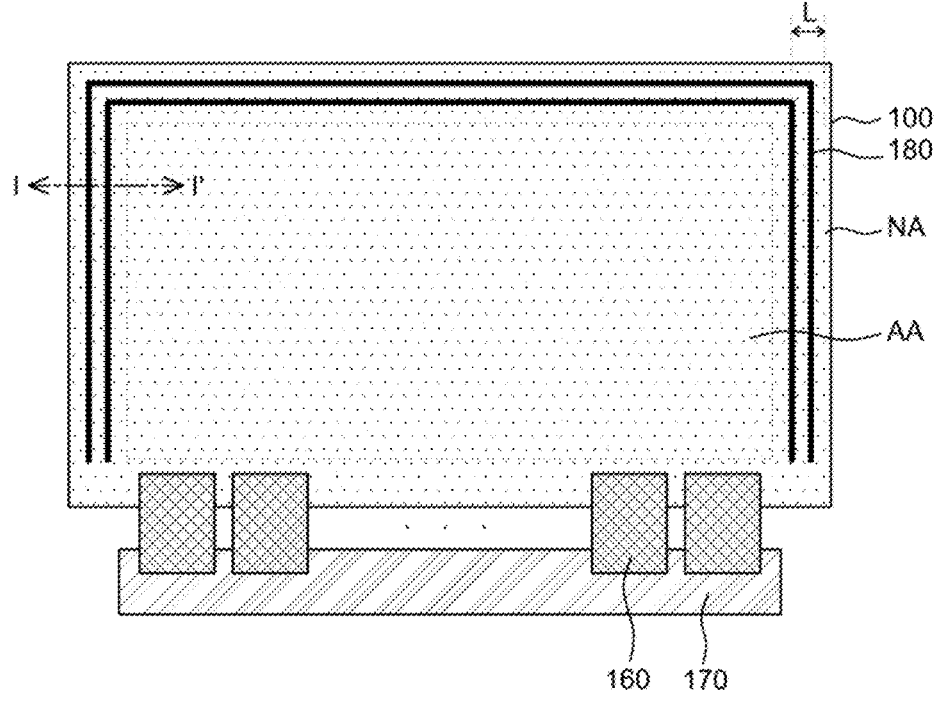
FIG. 1 is a plan view schematically illustrating an electroluminescent display device according to some aspects of the present disclosure.

Advantages and characteristics of the present disclosure and a method of achieving the advantages and characteristics will be clear by referring to exemplary embodiments described below in detail together with the accompanying drawings.

Various examples of the present disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure may be partially or entirely adhered to or combined with each other and may be interlocked and operated in technically various ways, and the embodiments may be carried out independently of or in association with each other.

Hereinafter, an electroluminescent display device according to exemplary embodiments of the present disclosure will be described in detail with reference to accompanying drawings.

FIG. 1 is a plan view schematically illustrating an electroluminescent display device according to some aspects of the present disclosure.

Referring to FIG. 1, the electroluminescent display device may include a display panel 100, flexible films 160, a printed circuit board 170, and trench patterns 180.

The display panel 100 can be a panel for displaying an image to a user.

The display panel 100 may include display elements for displaying an image, driving elements for driving the display elements, and lines for transmitting various signals to the display elements and the driving elements. The display elements may be defined differently depending on a type of the display panel 100. For example, when the display panel 100 is an organic light emitting display panel, the display element is an organic light emitting element including an anode, an organic light emitting layer, and a cathode. For example, when the display panel 100 is a liquid crystal display panel, the display element may be a liquid crystal display element.

Hereinafter, an organic light emitting display panel is described as an example of the display panel 100. However, but the display panel 100 is not limited to the organic light emitting display panel described herein.

The display panel 100 may include an active area AA and a non-active area NA.

The active area AA is an area in which an image is displayed on the display panel 100.

A plurality of sub-pixels constituting a plurality of pixels and a circuit for driving the plurality of sub-pixels may be disposed in the active area AA. The plurality of sub-pixels are minimum units constituting the active area AA, and the display element may be disposed in each of the plurality of sub-pixels, and the plurality of sub-pixels may constitute the pixel. For example, an organic light emitting element including an anode, an organic light emitting layer, and a cathode may be disposed in each of the plurality of sub-pixels, but is not limited thereto. In addition, the circuit for driving the plurality of sub-pixels may include a driving element, lines and the like. For example, the circuit may be formed of a thin film transistor, a storage capacitor, a gate line, a data line, and the like, but is not limited thereto.

The non-active area NA is an area in which an image is not displayed.

FIG. 1 illustrates that the non-active area NA surrounds the active area AA having a quadrangular shape, but shapes and arrangements of the active area AA and the non-active area NA are limited to the example illustrated in FIG. 1.

In other words, shapes of the active area AA and the non-active area NA may be suitable for a design of an electronic device on which the electroluminescent display device is mounted. For example, other exemplary shapes of the active area AA may be a pentagon, a hexagon, a circle, an oval, and the like.

Various lines and circuits for driving organic light emitting elements of the active area AA may be disposed in the non-active area NA. For example, in the non-active area NA, link lines for transmitting signals to the plurality of sub-pixels and circuits of the active area AA or driver ICs such as a gate driver IC and a data driver IC may be disposed, but are not limited thereto.

The electroluminescent display device may include various additional elements for generating various signals or driving pixels in the active area AA. The additional elements for driving the pixels may include an inverter circuit, a multiplexer, an electro-static discharge (ESD) circuit, and the like. The electroluminescent display device may also include additional elements associated with functions other than driving pixels. For example, the electroluminescent display device may include additional elements that provide a touch sensing function, a user authentication function (e.g., fingerprint recognition), a multi-level pressure sensing function, a tactile feedback function, and the like. Such additional elements may be located in the non-active area NA and/or in an external circuit connected to a connection interface.

The flexible film 160 is a film in which various components are disposed on a flexible base film. Specifically, the flexible films 160 are films for supplying signals to the plurality of sub-pixels and circuits of the active area AA, and may be electrically connected to the display panel 100. The flexible films 160 may be disposed at one end portion of the non-active area NA of the display panel 100 and supply a power voltage, a data voltage and the like to the plurality of sub-pixels and circuits of the active area AA. Meanwhile, the number of flexible films 160 may be changed according to design parameters, and is not limited to examples described herein.

Meanwhile, a driver IC such as a data driver IC may be disposed on the flexible films 160. The driver IC is a component that processes a data signal for displaying an image and a driving signal for processing it. The driver IC may be disposed in a manner such as a chip-on-glass (COG), chip-on-film (COF), or tape carrier package (TCP) according to a mounting method.

The printed circuit board 170 may be disposed at one ends of the flexible films 160 and connected to the flexible films 160. The printed circuit board 170 is a component that supplies signals to the driver IC. The printed circuit board 170 may supply various signals such as a driving signal and a data signal to the driver IC. For example, a data driver generating data signals may be mounted on the printed circuit board 170, and the generated data signals may be supplied to the plurality of sub-pixels and circuits of the display panel 100 through the flexible films 160. The number of printed circuit boards 170 may be changed according to design parameters, and is not limited to examples described herein.

Meanwhile, the electroluminescent display device requires a minimum bezel distance to secure reliability such as moisture permeation prevention or the like, and demand for slimming of the non-active area NA except for the active area AA where an image is displayed, is also increasing in accordance with demand for slimming of display devices. However, when a cathode and an organic layer are deposited, a shadow area is generated due to a gap between a mask and the substrate, so there is a limit to reducing a bezel.

Accordingly, first exemplary aspect of the present disclosure is characterized in that the trench pattern 180 in which a portion of the organic layer and the cathode is removed is disposed in the shadow area in the non-active area NA. That is, in the first exemplary aspect of the present disclosure, a rate of moisture penetration into a side surface of the display panel 100 may be delayed through the trench pattern 180. In addition, a bezel width may be reduced by converting the existing shadow area into a reliable bezel area L.

In this case, the trench patterns 180 may be formed over three sides of the non-active areas NA except for one side of the display panel 100 where the flexible films 160 are disposed, but the present disclosure is not limited thereto. That is, as shown in FIG. 1, the trench patterns 180 may be disposed across three sides including left and right sides and an upper side of the display panel 100 where the flexible films 160 are not disposed among four sides of the display panel 100. However, the present disclosure is not limited thereto. Based on FIG. 1, the trench patterns 180 may not be formed in a lower side of the display panel 100 because there is a risk of damage due to laser irradiation due to arrangement of driver ICs and application of voltage, but the present disclosure is not limited thereto.

The trench patterns 180 may be formed by removing the cathode and the organic layer in the shadow area outside the active area AA through laser ablation, for example. Accordingly, a reliable bezel area L may be expanded, and a bezel width may be reduced by the amount equal to a length of the expanded reliable bezel area L.

A more detailed description of the trench patterns 180 will be described in detail with reference to FIGS. 2 and 3.

Figure 2:
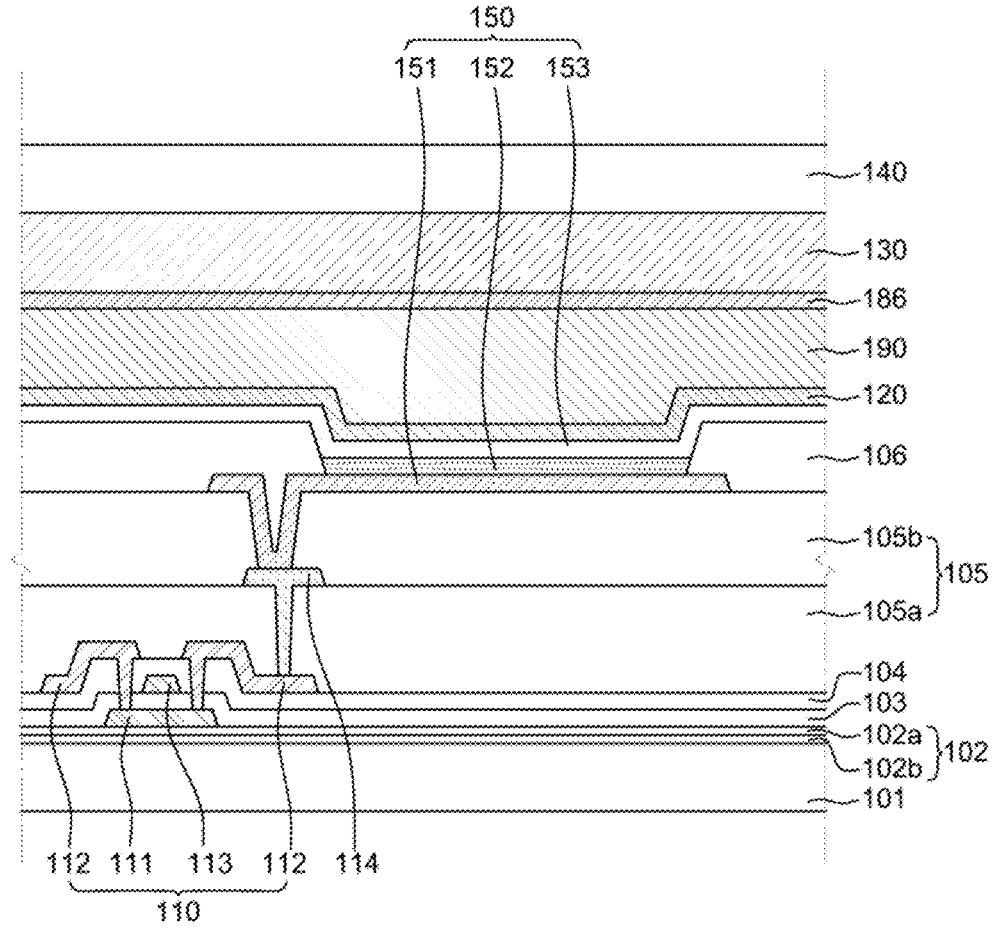
FIG. 2 is a cross-sectional view showing a sub-pixel of the electroluminescent display according to some aspects of the present disclosure.

FIG. 2 is a cross-sectional view showing a sub-pixel of the electroluminescent display according to some aspects of the present disclosure.

Figure 3:
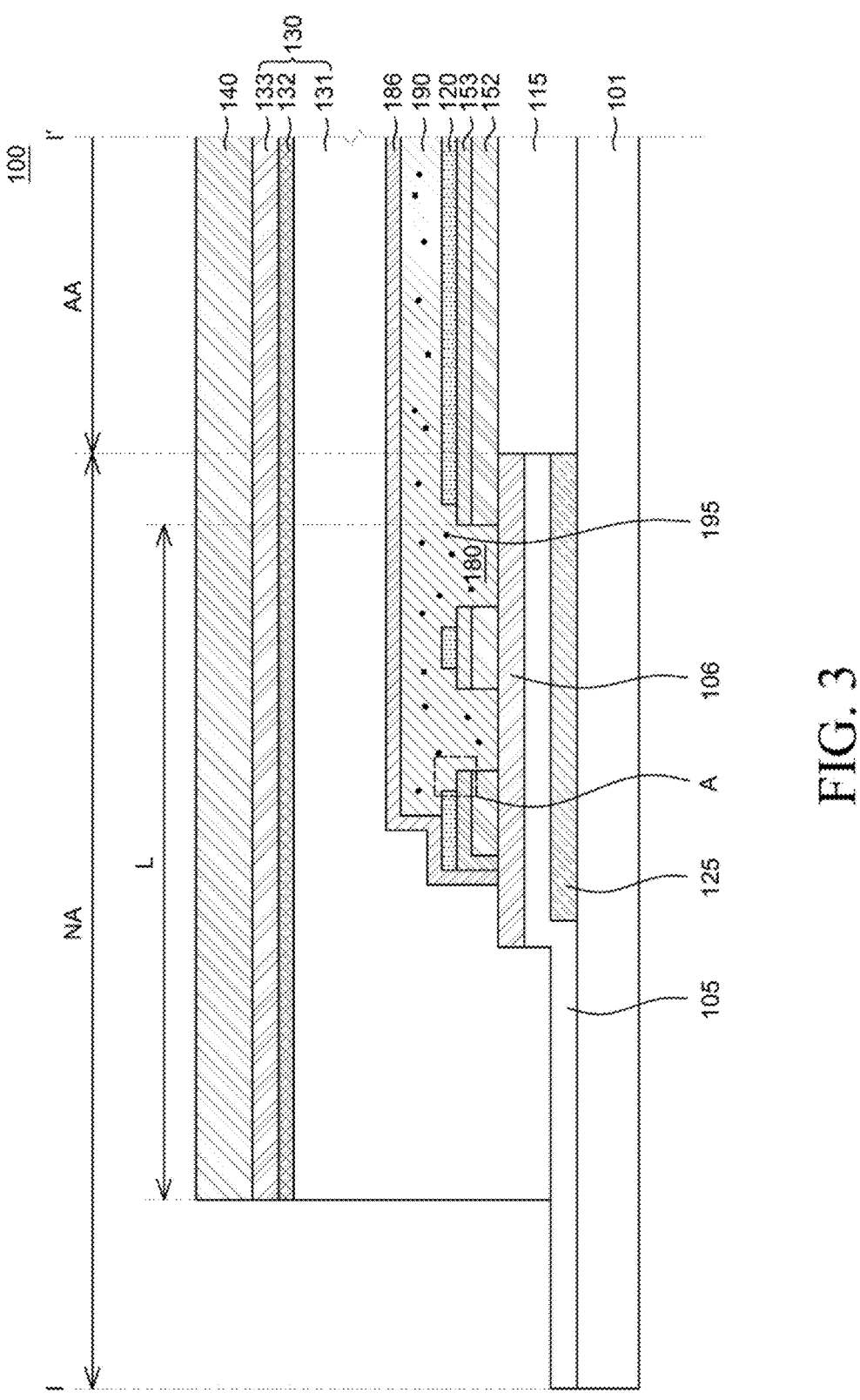
FIG. 3 is a cross-sectional view taken along I-I' of FIG. 1 according to some aspects of the present disclosure.

FIG. 3 is a cross-sectional view taken along I-I' of FIG. 1 according to some aspects of the present disclosure.

FIG. 2 is a cross-sectional view of one sub-pixel in the display panel 100 according to some aspects of the present disclosure. FIG. 3 illustrates a cross-section of the left side of the display panel 100 in which the trench pattern 180 is formed as an example. FIG. 3 schematically illustrates a pixel unit 115 in the active area AA and a GIP unit 125 in the non-active area NA for convenience of description.

Referring to FIGS. 2 and 3, in the display panel 100 according to the first exemplary aspect of the present disclosure, a driving element 110 may be disposed on a substrate 101.

In addition, a planarization layer 105 may be disposed on the driving element 110.

In addition, an organic light emitting element 150 that is electrically connected to the driving element 110 is disposed on the planarization layer 105, and a capping layer 120, a step alleviation layer 190, and an inorganic layer 186 may be disposed on the organic light emitting element 150 to minimize penetration of oxygen and moisture into the organic light emitting element 150.

A sealing member 130 and a reinforcement substrate 140 may be sequentially disposed on the inorganic layer 186, but are not limited thereto, and an encapsulation substrate may be disposed on the inorganic layer 186 with an adhesive layer interposed therebetween.

However, the display panel 100 according to the first exemplary aspect of the present disclosure is not limited to such a laminated structure.

Specifically, the substrate 101 may be a glass or plastic substrate. When the substrate 101 is a plastic substrate, a polyimide-based or polycarbonate-based material may be used to have flexibility. In particular, polyimide may be applied to a high-temperature process and is widely used as a plastic substrate because it is a material that may be coated.

A buffer layer 102 may be disposed on the substrate 101.

The buffer layer 102 is a layer for protecting various electrodes and lines from impurities such as alkali ions flowing out from the substrate 101 or lower layers thereof, and may have a multilayer structure formed of a first buffer layer 102*a* and a second buffer layer 102*b*, but the present disclosure is not limited thereto. The buffer layer 102 may be formed of silicon oxide (SiOx) or silicon nitride (SiNx) or multiple layers thereof.

In addition, the buffer layer 102 may delay diffusion of moisture and/or oxygen penetrating into the substrate 101. The buffer layer 102 may include a multi-buffer and/or an active buffer. The active buffer protects an active layer 111 configured as a semiconductor of the driving element 110 and may perform a function of blocking various kinds of impurities introduced from the substrate 101. The active buffer may be formed of amorphous silicon (a-Si) or the like.

The driving element 110 may be formed of the active layer 111, a gate electrode 113, and a source electrode and a drain electrode 112, and may be electrically connected to the organic light emitting element 150 through a connection electrode 114 to transmit a current or signals to the organic light emitting element 150.

The active layer 111 may be disposed on the buffer layer 102. The active layer 111 may be formed of polysilicon (p-Si), and in this case, a predetermined region thereof may be doped with impurities. In addition, the active layer 111 may be formed of amorphous silicon (a-Si) or may be formed of various organic semiconductor materials such as pentacene and the like. Also, the active layer 111 may be formed of an oxide semiconductor.

A gate insulating layer 103 may be disposed on the active layer 111.

The gate insulating layer 103 may be formed of an inorganic insulating material such as silicon oxide (SiOx) or silicon nitride (SiNx), or may be formed of an organic insulating material or the like.

The gate electrode 113 may be disposed on the gate insulating layer 103.

The gate electrode 113 may be formed of various conductive materials such as nickel (Ni), chromium (Cr), magnesium (Mg), aluminum (Al), molybdenum (Mo), tungsten (W), gold (Au), or alloys of them.

An interlayer insulating layer 104 may be disposed on the gate electrode 113.

The interlayer insulating layer 104 may be formed of an insulating material such as silicon oxide (SiOx) or silicon nitride (SiNx) and may also be formed of an organic insulating material or the like.

Contact holes exposing a source area and a drain region of the active layer 111 may be formed by selectively removing the gate insulating layer 103 and the interlayer insulating layer 104. The source electrode and the drain electrode 112 may be formed of an electrode material on the interlayer insulating layer 104, in a single-layer or multi-layer structure.

In some examples, an additional passivation layer formed of an inorganic insulating material may be formed to cover the source electrode and the drain electrode 112.

The planarization layer 105 may be disposed on the driving element 110 described above.

The planarization layer 105 may have a multilayer structure including at least two layers, and may include, for example, a first planarization layer 105*a* and a second planarization layer 105*b*. The first planarization layer 105*a* may be disposed to cover the driving element 110, and may be disposed such that portions of the source electrode and the drain electrode 112 of the driving element 110 are exposed.

The planarization layer 105 may extend to the non-active area NA to cover the GIP unit 125.

The planarization layer 105 may have a thickness of about 2 μm, but is not limited thereto.

The planarization layer 105 may be an overcoat layer, but is not limited thereto.

Meanwhile, the connection electrode 114 for electrically connecting the driving element 110 and the organic light emitting element 150 may be disposed on the first planarization layer 105*a*. In addition, although not shown in FIG.

2, various metal layers serving as lines/electrodes such as data lines or signal lines may be disposed on the first planarization layer 105*a*.

In addition, the second planarization layer 105*b* may be disposed on the first planarization layer 105*a* and the connection electrode 114.

The planarization layer 105 is formed of two layers in the display panel 100 according to the first exemplary aspect of the present disclosure. It is because various signal lines increase as the display panel 100 has a higher resolution. Since it is difficult to arrange all lines on one layer while securing a minimum distance between the lines, an additional layer is created. Due to the addition of an additional layer, that is, the second planarization layer 105*b*, a margin is created in arrangement of the lines, and arrangement design of lines/electrodes may be facilitated. In addition, when a dielectric material is used as the planarization layer 105 formed of multiple layers, the planarization layer 105 may also be used for forming capacitance between metal layers.

The second planarization layer 105*b* may be formed such that a portion of the connection electrode 114 is exposed, and the drain electrode 112 of the driving element 110 and an anode 151 of the organic light emitting element 150 may be electrically connected by the connection electrode 114.

The organic light emitting elements 150 may be configured by sequentially disposing the anode 151, a plurality of organic layers 152, and a cathode 153. That is, the organic light emitting element 150 may include the anode 151 formed on the planarization layer 105, the organic layer 152 formed on the anode 151, and the cathode 153 formed on the organic layer 152.

The electroluminescent display device may be implemented in a top emission method or bottom emission method. In the case of the top emission method, a reflective layer formed of an opaque conductive material with high reflectivity, for example, silver (Ag), aluminum (Al), gold (Au), molybdenum (Mo), tungsten (W), chromium (Cr), or an alloy thereof, may be added under the anode 151 so that light emitted from the organic layer 152 is reflected by the anode 151 and is directed upwardly, that is, in a direction of the cathode 153 disposed thereover. Conversely, in the case of the bottom emission method, the anode 151 may be formed of only a transparent conductive material such as indium tin oxide (ITO), indium zinc oxide (IZO), or indium gallium zinc oxide (IGZO). Hereinafter, it is described assuming that the electroluminescent display device of the present disclosure is in the bottom emission method.

A bank 106 may be formed in an area other than a light emitting area on the planarization layer 105. That is, the bank 106 has a bank hole that exposes the anode 151 corresponding to the light emitting area. The bank 106 may be formed of an inorganic insulating material such as silicon nitride (SiNx) or silicon oxide (SiOx), or an organic insulating material such as BCB, acrylic resin, or imide resin.

The bank 106 may extend to the non-active area NA.

That is, the bank 106 may extend to a portion of the non-active area NA to be spaced apart from an end portion of the substrate 101 by a predetermined distance.

The bank 106 may have a thickness of about 1 μm, but is not limited thereto.

The bank 106 may cover an upper portion of the GIP unit 125, but is not limited thereto.

The organic layer 152 may be disposed on the anode 151 that is exposed by the bank 106. The organic layer 152 may include the light emitting layer, an electron injection layer, an electron transport layer, a hole transport layer, a hole injection layer, and the like.

The organic layer 152 may extend to the non-active area NA.

The organic layer 152 may extend to a portion of the non-active area NA to be spaced apart from the end portion of the substrate 101 by a predetermined distance.

In the non-active area NA, the organic layer 152 may be disposed on the bank 106.

The cathode 153 may be disposed on the organic layer 152.

In the case of the top emission method, the cathode 153 may include a transparent conductive material. For example, the cathode 153 may be formed of indium tin oxide (ITO), indium zinc oxide (IZO), indium gallium zinc oxide (IGZO), or the like. In the case of the bottom emission method, the cathode 153 may include any one of metallic materials such as gold (Au), silver (Ag), aluminum (Al), molybdenum (Mo), magnesium (Mg), palladium (Pd), copper (Cu) or the like, or groups consisting of alloys thereof. Alternatively, the cathode 153 may be configured by stacking a layer formed of a transparent conductive material such as indium tin oxide (ITO), indium zinc oxide (IZO) or indium gallium zinc oxide (IGZO), and a layer formed of a metallic material such as gold (Au), silver (Ag), aluminum (Al), molybdenum (Mo), magnesium (Mg), palladium (Pd), copper (Cu) or the like, or alloys thereof, but is not limited thereto.

The cathode 153 may extend to the non-active area NA.

The cathode 153 may be spaced apart from an end portion of the bank 106 by a predetermined distance and come into contact with a portion of the upper surface of the bank 106.

The cathode 153 may be disposed to cover a side surface of the organic layer 152 in the non-active area NA. The organic layer 152 may be spaced apart from an end portion of the cathode 153 by a predetermined distance, but is not limited thereto.

The capping layer 120 formed of a material having a high refractive index and high light absorption may be disposed on the organic light emitting element 150 to reduce diffused reflection of external light.

The capping layer 120 may be an organic layer formed of an organic material, and may be omitted if necessary.

The capping layer 120 may extend to the non-active area NA. In the non-active area NA, the capping layer 120 may be disposed on the cathode 153.

Meanwhile, the display panel 100 according to the first exemplary aspect of the present disclosure is characterized in that the trench pattern 180 is formed by selectively removing portions of the capping layer 120, the cathode 153, and the organic layer 152 in the non-active area NA. The trench pattern 180 may be disposed in a shadow area between end portions of the cathodes 153 in the non-active area NA outside the active area AA.

In addition, the display panel 100 according to the first exemplary aspect of the present disclosure is characterized in that the capping layer 120 adjacent to the trench pattern 180 is inwardly recessed (or retracted) more than the cathode 153. Here, the term 'inwardly' means an inward direction toward a central portion of the capping layer 120 and the cathode 153, and may mean that the capping layer 120 is removed to be recessed from the end portion of the cathode 153.

That is, the trench pattern 180 may be formed by, for example, removing the capping layer 120, the cathode 153, and the organic layer 152 of the shadow area outside the active area AA through laser ablation. In this case, as the capping layer 120 melts faster than the cathode 153, the capping layer 120 may be removed to be recessed inwardly more than the cathode 153. Meanwhile, in the case of the planarization layer 105 and the bank 106, they may be removed through a photo-process, and through this, the trench pattern 180 may extend downward, but is not limited thereto.

The trench pattern 180 may be formed to have a width of about 70 µm when a width of laser beam is 50 µm, but is not limited thereto. This takes into account a width (up to 20 µm) of an area affected by laser heat.

A portion of the cathode 153 adjacent to the trench pattern 180 may be spaced apart from the organic layer 152. A more detailed description of shapes of the capping layer 120, the cathode 153, and the organic layer 152 after laser irradiation will be described later with reference to FIGS. 4A to 4C and FIG. 5A to 5C.

In the case of the first exemplary aspect of the present disclosure, as the trench pattern 180 is formed in the non-active area NA, the cathode 153 of the active area AA and the cathode 153 of the non-active area NA may be disconnected, which may have the effect of substantially retracting the end portion of the cathode 153 toward the active area AA, thereby allowing for an increase in the reliable bezel area L and a reduction in bezel width.

As described above, the electroluminescent display device has a minimum bezel distance (the reliable bezel area L) to secure reliability such as moisture permeation prevention.

In this case, the reliable bezel area L may be defined as a distance from an end portion of the reinforcement substrate 140 to the end portion of the cathode 153. An area excluding the reliable bezel area L in the non-active area NA may be referred to as a shadow area and is located outside the active area AA. The shadow area may be defined by a gap between a mask and the substrate 101 when the cathode 153 and the organic layer 152 are deposited.

The first exemplary aspect of the present disclosure is characterized in that the trench 180 is disposed outside the shadow area, that is, within the reliable bezel area L.

In FIG. 3, a case in which two trench patterns 180 are provided is illustrated as an example, but the present disclosure is not limited thereto. The number of trench patterns 180 may be more or less.

In a non-limiting example, a protective layer for protecting the GIP unit 125 from laser ablation may be additionally disposed on an inner bottom of the trench pattern 180.

In this case, the protective layer may be formed of a transparent conductive material constituting the anode 151 to absorb 100% of a laser when using the laser having a wavelength range of about 266 nm in an ultraviolet region. The transparent conductive material may include indium tin oxide (ITO), indium zinc oxide (IZO), or indium gallium zinc oxide (IGZO).

The step alleviation layer 190, the inorganic layer 186, the sealing member 130, and the reinforcement substrate 140 may be disposed on the capping layer 120, as well as an inner portion of the trench pattern 180.

First, the step alleviation layer 190 may be disposed on the capping layer 120 and may be disposed to fill the inner portion of the trench pattern 180. That is, the step alleviation layer 190 may be disposed to fill the inner portion of the trench pattern 180 to alleviate a stepped portion caused by the trench pattern 180 and planarize an upper portion of the trench pattern 180.

In addition, the step alleviation layer 190, together with the capping layer 120, the inorganic layer 186, and the reinforcement substrate 140, may protect the organic light emitting element 150 of the pixel unit 115 from external moisture, oxygen, impacts, and the like.

The step alleviation layer 190 may be formed of an organic material.

For example, the step alleviation layer 190 may include a resin formed of an organic material and getters 195 dispersed in the resin.

The resin of the step alleviation layer 190 may be formed of an organic material. For example, the step alleviation layer 190 may include an epoxy resin, an acrylic resin, and a silicon oxycarbon (SiOC) resin.

The step alleviation layer 190 may include the getters 195. The getters 195 may be dispersed in the resin described above.

The getters 195 may include at least one of barium oxide (BaO), calcium oxide (CaO), magnesium oxide (MgO), magnesium sulfate ($MgSO_4$), sodium oxide ($Na_2O$), sodium sulfate ($Na_2SO_4$), lithium sulfate (LiSO), calcium sulfate ($CaSO_4$), potassium oxide ($K_2O$), lithium oxide ($Li_2O$), gallium sulfate (GaS), calcium chloride ($CaCl^2$), magnesium chloride ($MgCl_2$), calcium bromide ($CaBr_2$), cerium bromide (CsBr), vanadium bromide ($VBr_5$) and calcium nitrate ($Ca(No_3)_2$).

The getters 195 may be formed of particles having a size of about 50 to 100 nm. The getters 195 may be formed of a transparent material, but are not limited thereto.

The step alleviation layer 190 may be implemented as a film. That is, the step alleviation layer 190 is not formed by applying and curing a liquid material, but may be implemented in the form of a film and disposed on the capping layer 120. Accordingly, the step alleviation layer 190 may be formed of an organic film.

In the case of the first exemplary aspect of the present disclosure, the step alleviation layer 190 may be disposed to be in contact with a portion of an upper surface of the capping layer 120 disposed outside an outermost trench pattern 180 as well as the capping layer 120, the exposed cathode 153, and the inner portion of the trench pattern 180. However, the present disclosure is not limited thereto. Here, the outermost trench pattern 180 may refer to the trench pattern 180 positioned at an outermost portion when a plurality of the trench patterns 180 are disposed.

The inorganic layer 186 formed of an inorganic insulating material may be disposed on the step alleviation layer 190. The inorganic layer 186 may delay moisture permeation from an upper portion thereof and suppress defects caused by dents or foreign materials.

In this case, the inorganic layer 186 may be disposed to be in contact with an upper surface of the step alleviation layer 190 and the other portion of the upper surface of the capping layer 120. That is, the inorganic layer 186 may cover the upper surface and a side surface of the step alleviation layer 190 to encapsulate the step alleviation layer 190. In addition, the inorganic layer 186 may cover a side surface and the other portion of the upper surface of the capping layer 120 and a side surface of the cathode 153 disposed outside the outermost trench pattern 180, which are not completely covered by the step alleviation layer 190.

The inorganic layer 186 may be formed of silicon oxide (SiOx), silicon nitride (SiNx), or multiple layers thereof to delay moisture permeation, but is not limited thereto.

An encapsulation structure of a multilayer structure composed of the sealing member 130 and the reinforcement substrate 140 may be disposed on the inorganic layer 186, but the present disclosure is not limited thereto. An encapsulation substrate may be disposed on the inorganic layer 186 with an adhesive layer interposed therebetween.

Small-sized display panels used in mobile and portable devices have small areas, so heat is quickly dissipated from elements and there are few defects with adhesion, whereas large-sized display panels used in monitors, tablets, and television receivers have large areas and thus, an encapsulation structure for optimal heat dissipation and adhesion is required.

In addition, to secure insufficient rigidity, the electroluminescent display device may further include a separate inner plate on an upper portion of the encapsulation substrate. In this case, it is necessary to secure a space for arranging a separate inner plate, and there are limitations in slimming and reducing a weight of the electroluminescent display device due to a weight of the inner plate. In addition, a vertical separation space is generated by an air gap generated between the encapsulation substrate and the inner plate by the amount equal to a thickness of an adhesive tape disposed to bond the encapsulation substrate and the inner plate, thereby causing a limit to reducing heat dissipation performance.

Therefore, the first exemplary aspect of the present disclosure is characterized by applying an encapsulation structure of a multilayer structure including the sealing member 130 capable of preventing process defects and fixing a relatively thick reinforcement substrate 140 while removing a separate inner plate.

The sealing member 130 according to the present disclosure may include a first adhesive layer 131 facing the substrate 101, a second adhesive layer 133 facing the reinforcement substrate 140, and a barrier layer 132 disposed between the first adhesive layer 131 and the second adhesive layer 133.

Each of the first adhesive layer 131 and the second adhesive layer 133 may be formed of an adhesive polymer material. For example, the first adhesive layer 131 may be formed of any one of olefin-based, epoxy-based, and acrylate-based polymer materials. In addition, the second adhesive layer 133 may be formed of any one of olefin-based, epoxy-based, acrylate-based, amine-based, phenol-based, and acid anhydride-based polymer materials that do not contain a carboxyl group. In particular, the second adhesive layer 133 is preferably formed of a polymer material that does not contain a carboxyl group for film uniformity and corrosion prevention of the barrier layer 132.

To dissipate heat from the substrate 101, at least the first adhesive layer 131 among the first and second adhesive layers 131 and 133 may be formed of a mixture including particles of an adhesive polymer material and a metal material. there is. For example, the particle of the metal material may be powder formed of nickel (Ni). The first adhesive layer 131 in direct contact with the substrate 101 is formed of a mixture including particles of an adhesive polymer material and a metal material, and thus may have higher thermal conductivity than that of the adhesive polymer material.

Similarly, the second adhesive layer 133 may be formed of a mixture including particles of an adhesive polymer material and a metal material and have higher thermal conductivity than that of the adhesive polymer material.

In this manner, a speed at which driving heat generated in the substrate 101 is dissipated through the sealing member 130 may be improved. Therefore, a heat dissipation effect of the substrate 101 may be improved.

In addition, to prevent moisture permeation to the pixel unit 115, the first adhesive layer 131 may be formed of a mixture further including an inorganic filler having moisture absorbing properties. In this case, the inorganic filler having moisture absorbing properties may be at least one of barium oxide (BaO), calcium oxide (CaO), and magnesium oxide (MgO).

Unlike the first adhesive layer 131, the second adhesive layer 133 does not directly contact the pixel unit 115, and thus does not need to include an inorganic filler to prevent moisture permeation of the pixel unit 115. Accordingly, the second adhesive layer 133 may include only particles of an adhesive polymer material and a metal material without including the inorganic filler having moisture absorbing properties. In this manner, the amount of relatively expensive inorganic filler (having moisture absorbing properties) injected into the sealing member 130 may be reduced, and thus the cost of preparing the sealing member 130 may be reduced.

In addition, since a mixing ratio of the polymer material included in the second adhesive layer 133 may be increased compared to that of the first adhesive layer 131 as long as the inorganic filler having moisture absorbing properties is not included, adhesion of the second adhesive layer 133 may be improved as compared to that of the first adhesive layer 131. Accordingly, as the reinforcement substrate 140 is more firmly fixed onto the second adhesive layer 133, reliability of bonding force between the substrate 101 and the reinforcement substrate 140 may be further improved.

In addition, as the multilayer structure of the first adhesive layer 131 and the second adhesive layer 133 is formed, reliability of reducing a warpage phenomenon in which the display panel is bent may also be improved.

A thickness of each of the first and second adhesive layers 131 and 133 may be limited to a critical thickness or less to prevent process defects. In addition, the sum of the thicknesses of the first and second adhesive layers 131 and 133 may be limited to a critical thickness or more for securing reliability of fixing the reinforcement substrate 140.

For example, each of the first and second adhesive layers 131 and 133 may have a thickness within a range of 10 um to 100 um.

The barrier layer 132 may be formed of any one of a metal material and an inorganic insulating material. That is, the barrier layer 132 may include a metal material such as Al, Cu, Sn, Ag, Fe, or Zn. In another example, the barrier layer 132 may be formed of a thin film of an inorganic insulating material such as SiOx and SiONx.

The barrier layer 132 may be introduced to realize a laminated structure for reinforcing adhesion with the first and second adhesive layers 131 and 133 and reducing warpage. Specifically, each of the first and second adhesive layers 131 and 133 includes an adhesive polymer material. Accordingly, the barrier layer 132 having a relatively hard material is disposed between the first adhesive layer 131 and the second adhesive layer 133 and thus, one side and the other side of the barrier layer 132 are bonded to the first adhesive layer 131 and the second adhesive layer 133, respectively, so that bonding strength may be improved.

At this time, a thickness of the barrier layer 132 may be limited to a value smaller than thicknesses of the first and second adhesive layers 131 and 133 to minimize an increase in thickness of the sealing member 130 due to the barrier layer 132. For example, the thickness of the barrier layer 132 may be greater than 10 μm and smaller than that of each of the first and second adhesive layers 131 and 133.

In this manner, the sealing member 130 according to the first exemplary aspect of the present disclosure includes the first and second adhesive layers 131 and 133 separated by the barrier layer 132. Accordingly, the sealing member 130 may be implemented with a thickness twice as thick as a single-layer adhesive material without a process defect. Due to the thickness of the reinforcement substrate 140 fixed by the sealing member 130, there is an advantage in that rigidity increase and heat dissipation effects may be easily realized. In other words, when the thickness of the sealing member 130 is within a range of 30 um to 300 um, the thickness of the reinforcement substrate 140 may be implemented as a thickness within a range of 0.1 mm to 1.5 mm.

In some aspects, the reinforcement substrate 140 may be formed of any one material among glass, metal, and plastic polymer. In some aspects, the reinforcement substrate 140 may be formed of a metal material including Al, Cu, Sn, Ag, Fe, or Zn.

The sealing member 130 and the reinforcement substrate 140 may extend to the non-active area NA to cover a portion of the planarization layer 105 and the bank 106.

Meanwhile, as described above, a lifting phenomenon, in which a part of the cathode 153 disposed adjacent to the trench pattern 180 is separated from the organic layer 152, may occur due to laser irradiation. This lifting phenomenon may be prevented through a reduction in size of a laser spot or the step alleviation layer 190 described above.

Figure 4A:
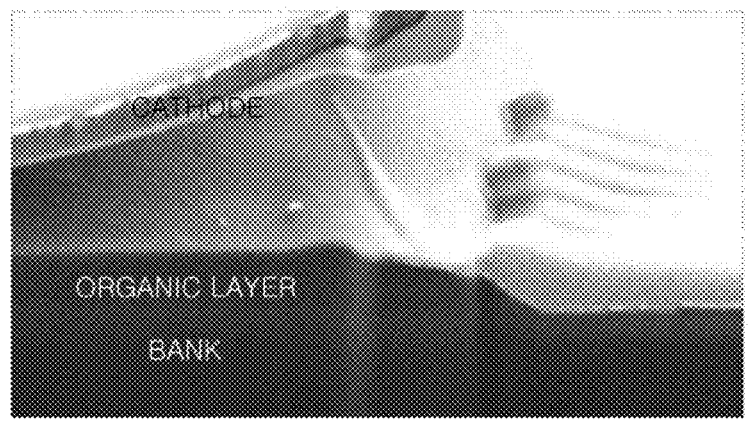
FIGS. 4A to 4C are focused ion beam (FIB) images of area A of FIG. 3 according to some aspects of the present disclosure.
Figure 4B:
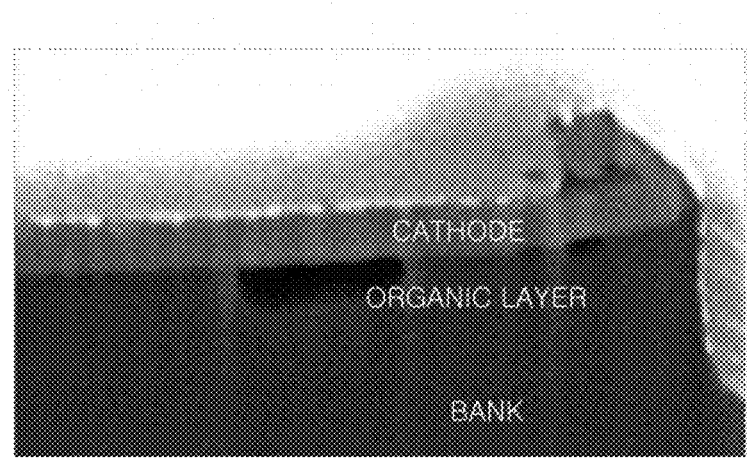
Figure 4C:
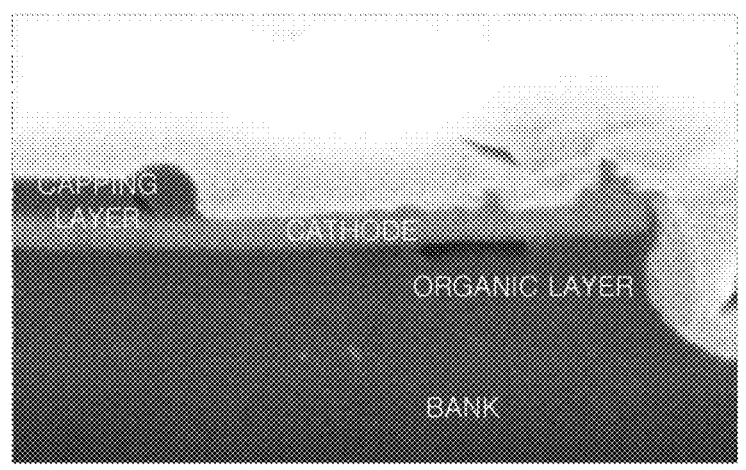

FIGS. 4A to 4C are focused ion beam (FIB) images of area A of FIG. 3 according to some aspects of the present disclosure.

Figure 5A:
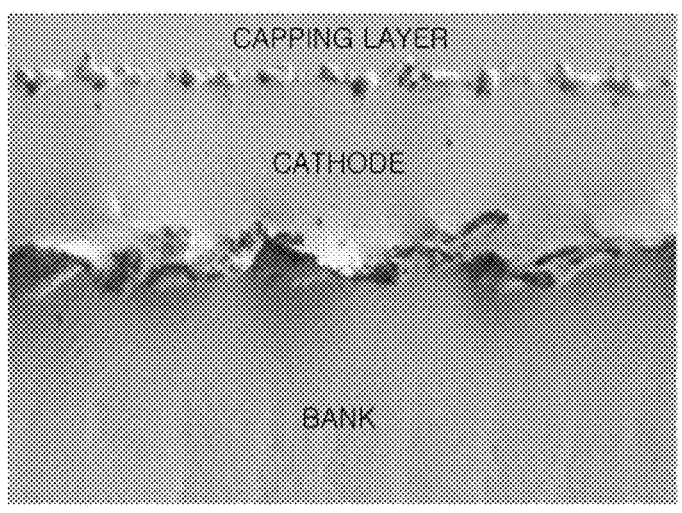
FIGS. 5A to 5C are FIB images of area A of FIG. 3 when viewed from above according to some aspects of the present disclosure.
Figure 5B:
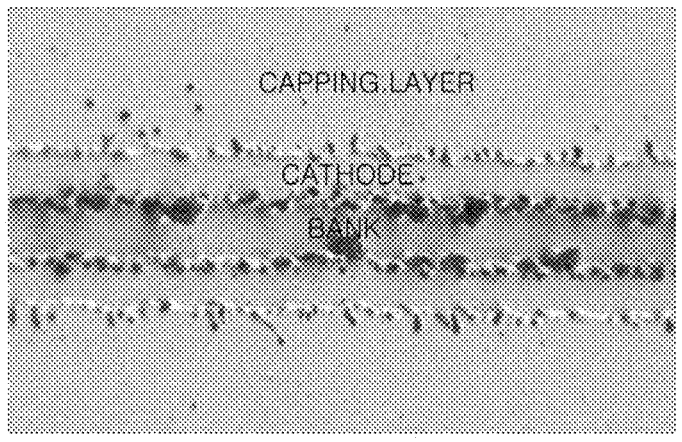
Figure 5C:
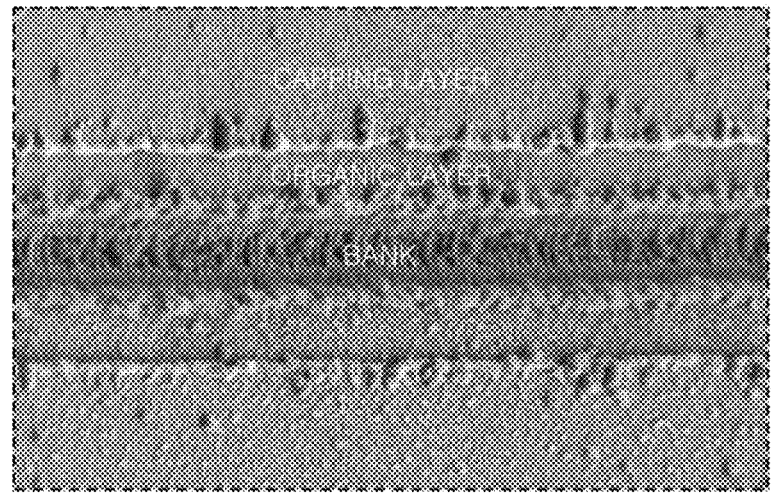

FIGS. 5A to 5C are FIB images of area A of FIG. 3 when viewed from above according to some aspects of the present disclosure.

FIGS. 4A to 4C and FIGS. 5A to 5C illustrate shapes of an organic layer, a cathode, and a capping layer disposed adjacent to a trench pattern as examples.

FIGS. 4A and 5B show an example in which a trench is formed using a laser having a spot size of about 30 μm, FIGS. 4B and 5B show a case in which a trench is formed using a laser having a spot size of about 8 μm, and FIGS. 4C and 5C show a case in which a trench is formed using a laser having a spot size of about 3 μm.

Referring to FIGS. 4A to 4C and FIGS. 5A to 5C, a portion of the cathode adjacent to a trench pattern may be spaced apart from the organic layer. As described above, the trench pattern may be formed by removing the capping layer, the cathode, and the organic layer in a shadow area outside the active area through laser ablation. In this case, due to a difference in laser absorption between the capping layer, the cathode, and the organic layer, a portion of the cathode adjacent to the trench pattern may be separated from the organic layer, causing a delamination or lifting phenomenon. Also, the capping layer adjacent to the trench pattern may be removed to be recessed inwardly more than the cathode. That is, as the capping layer is melted faster by the laser than the cathode, the capping layer may be removed so that the capping layer is more inwardly recessed than the cathode.

For example, referring to FIGS. 4A and 5A, when the trench pattern is formed using a laser having a spot size of about 30 μm, a portion of the cathode in an area adjacent to the trench pattern may be lifted upward. That is, an end portion of the cathode may be lifted upward and spaced apart from the organic layer. In this case, the capping layer adjacent to the trench pattern may be removed to be recessed inwardly more than the cathode.

At this time, a laser processing speed may be about 600 mm per second.

Also, for example, referring to FIGS. 4B and 5B, when a trench pattern is formed with a laser having a spot size of about 8 μm, an end of the cathode in an area adjacent to the trench pattern is bent upward and then, bent in a direction of the organic layer, so that it has a rolled shape. In this case, the capping layer adjacent to the trench pattern may be removed to be recessed inwardly more than the cathode.

At this time, the laser processing speed may be about 100 mm per second.

Also, for example, referring to FIGS. 4C and 5C, when a trench pattern is formed with a laser having a spot size of about 3 μm, it may be seen that lifting and rolling of the end of the cathode in an area adjacent to the trench pattern are alleviated. In this case, also, the capping layer adjacent to the trench pattern may be removed to be recessed inwardly more than the cathode.

At this time, the laser processing speed may be about 10 mm per second.

In this manner, when a laser spot size is reduced and the processing speed is reduced, the lifting of the cathode may be reduced, and a height of the end of the cathode may be maintained uniformly.

However, a shape of a portion of the cathode in the area adjacent to the trench pattern is not limited to those shown in FIGS. 4A to 4C and may have various shapes.

Referring back to FIG. 3, the step alleviation layer 190 may be disposed on the capping layer 120 to fill the trench pattern 180. That is, the step alleviation layer 190 may cover the side surface of the cathode 153 and the side surface of the organic layer 152 where a stepped portion is formed according to the lifting of the cathode 153 in the area adjacent to the trench pattern 180. In addition, the step alleviation layer 190 may cover a rolled or lifted shape of the cathode 153 by filling the separated space between the cathode 153 and the organic layer 152. In other words, as shown in FIGS. 4A to 4C, the step alleviation layer 190 may fill the separated space generated when a portion of the cathode 153 adjacent to the trench pattern 180 is spaced apart from the organic layer 152 and planarize the upper portions of the cathode 153 and the capping layer 120.

As described above, in response to demand for reducing the thickness of an electroluminescent display device, attempts are made to reduce the thickness of a non-active area of the electroluminescent display device e. When a cathode and an organic layer are deposited, a shadow area is generated by a gap between a mask and a substrate, so there is a limit to reducing a bezel.

In addition, a minimum bezel distance is required to secure reliability such as moisture permeation prevention in current electroluminescent display devices, and this may be referred to as a reliability bezel. For example, the reliability bezel may be defined from an end portion of an upper substrate (encapsulation substrate) to an end portion of the cathode. Accordingly, there is a limit to reducing the bezel to secure a reliable bezel.

Therefore, in the electroluminescent display device according to the first exemplary aspect of the present disclosure, the trench pattern 180 in which portions of the capping layer 120, the cathode 153, and the organic layer 152 are removed may be formed to secure reliability such as moisture permeation prevention. Accordingly, by forming the trench pattern 180 in an unnecessary shadow area generated by using a deposition mask, a rate of moisture permeation from the side surface of the device may be delayed, thereby improving reliability and reducing a bezel width.

Meanwhile, a laser ablation method may be used to remove the capping layer 120, the cathode 153, and the organic layer 152 during formation of the trench pattern 180.

However, due to a difference in laser absorption between the capping layer 120, the cathode 153, and the organic layer 152, a phenomenon may occur in which a portion of the cathode 153 adjacent to the trench pattern 180 is separated from the organic layer 152 and is rolled or lifted. For example, the end portion of the cathode 153 may protrude or lift upward in an area adjacent to the trench pattern 180 to which a laser is irradiated. In particular, as the area to which the laser is irradiated increases, rolling and lifting of the cathode 153 may be intensified, and the lifting phenomenon between the cathode 153 and the organic layer 152 may also be intensified. In addition, the capping layer 120 adjacent to the trench pattern 180 may be removed to be recessed inward more than the cathode 153. Accordingly, a stepped portion may be generated by the cathode 153 in the area adjacent to the trench pattern 180, and a foreign material may be formed due to residues generated during a laser irradiation process. In addition, the upper surface of the cathode 153 may become uneven, so quality of layers disposed over the cathode 153 may be degraded. Specifically, when an inorganic layer that delays moisture permeation is disposed on an upper portion of the cathode 153, the inorganic layer may be damaged by occurrence of seams and foreign materials, and defects such as moisture permeation through a damaged interface may occur.

Accordingly, the first exemplary aspect of the present disclosure is characterized in that the step alleviation layer 190 capable of securing step coverage is disposed over the trench pattern 180. In a process of forming the trench pattern 180, the cathode 153 may be spaced apart from the organic layer 152 disposed thereunder. Accordingly, the step alleviation layer 190 may fill the trench pattern 180 and fill the space between the cathode 153 and the organic layer 152 generated from laser ablation to thereby alleviate a rapid step change according to a protruding shape of the cathode 153. In addition, by planarizing the upper portion of the trench pattern 180, a stepped portion due to a shape of the ends of the capping layer 120 and the cathode 153 may be reduced, thereby preventing generation of seams.

Accordingly, degradation in quality of layers disposed on the upper portion of the cathode 153 may be prevented, and flatness of the inorganic layer 186 may be improved when the inorganic layer 186 is disposed on the upper portion of the cathode 153. Consequently, reliability of moisture barrier performance of the electroluminescent display device may be improved.

In addition, the first exemplary aspect of the present disclosure may include the getters 195 in the step alleviation layer 190 to delay moisture permeation. The getter 195 may absorb moisture and oxygen introduced into an inner space of the step alleviation layer 190 and prevent moisture from being diffused. Accordingly, it is possible to control a path of moisture permeation through layers disposed under the step alleviation layer 190.

Figures 6, 7:
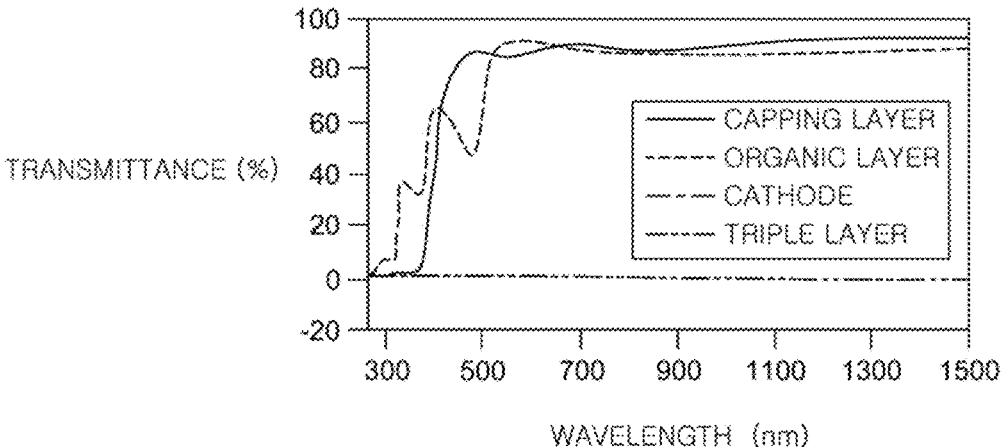
FIG. 6 is a graph showing transmittance according to wavelengths for a capping layer, an organic layer, a cathode, and a triple layer according to some aspects of the present disclosure.
FIG. 7 is a table showing transmittance according to laser wavelengths for the capping layer, the organic layer, the cathode, and the triple layer according to some aspects of the present disclosure.

FIG. 6 is a graph showing transmittance according to wavelengths for a capping layer, an organic layer, a cathode, and a triple layer according to some aspects of the present disclosure.

FIG. 7 is a table showing transmittance according to laser wavelengths for the capping layer, the organic layer, the cathode, and the triple layer according to some aspects of the present disclosure.

Referring to FIG. 6, it may be seen that the transmittance of the capping layer and the organic layer increases as the wavelength increases. On the other hand, in the case of the cathode and the triple layer, transmittance of almost 0% is shown in all wavelength ranges.

Referring to FIG. 7, in the case of a laser wavelength of 1064 nm, it may be seen that transmittances of the capping layer, the organic layer, the cathode, and the triple layer are 90.06%, 86.16%, 0%, and 0%, respectively.

In addition, in the case of a laser wavelength of 532 nm, it may be seen that the transmittances of the capping layer, the organic layer, the cathode, and the triple layer are 84.25%, 90.12%, 0%, and 0.03%, respectively.

In addition, in the case of a laser wavelength of 355 nm, it may be seen that the transmittances of the capping layer, the organic layer, the cathode, and the triple layer are 1.2%, 32.8%, 0%, and 0%, respectively.

Therefore, to simultaneously remove the triple layer, it is preferable to use a UV laser of 355 nm because the capping layer and the organic layer need to have high absorption rates with respect to laser irradiation wavelengths.

Meanwhile, the inorganic layer of the present disclosure may be formed to extend to the non-active area, which will be described in detail with reference to FIG. 8 below.

Figure 8:
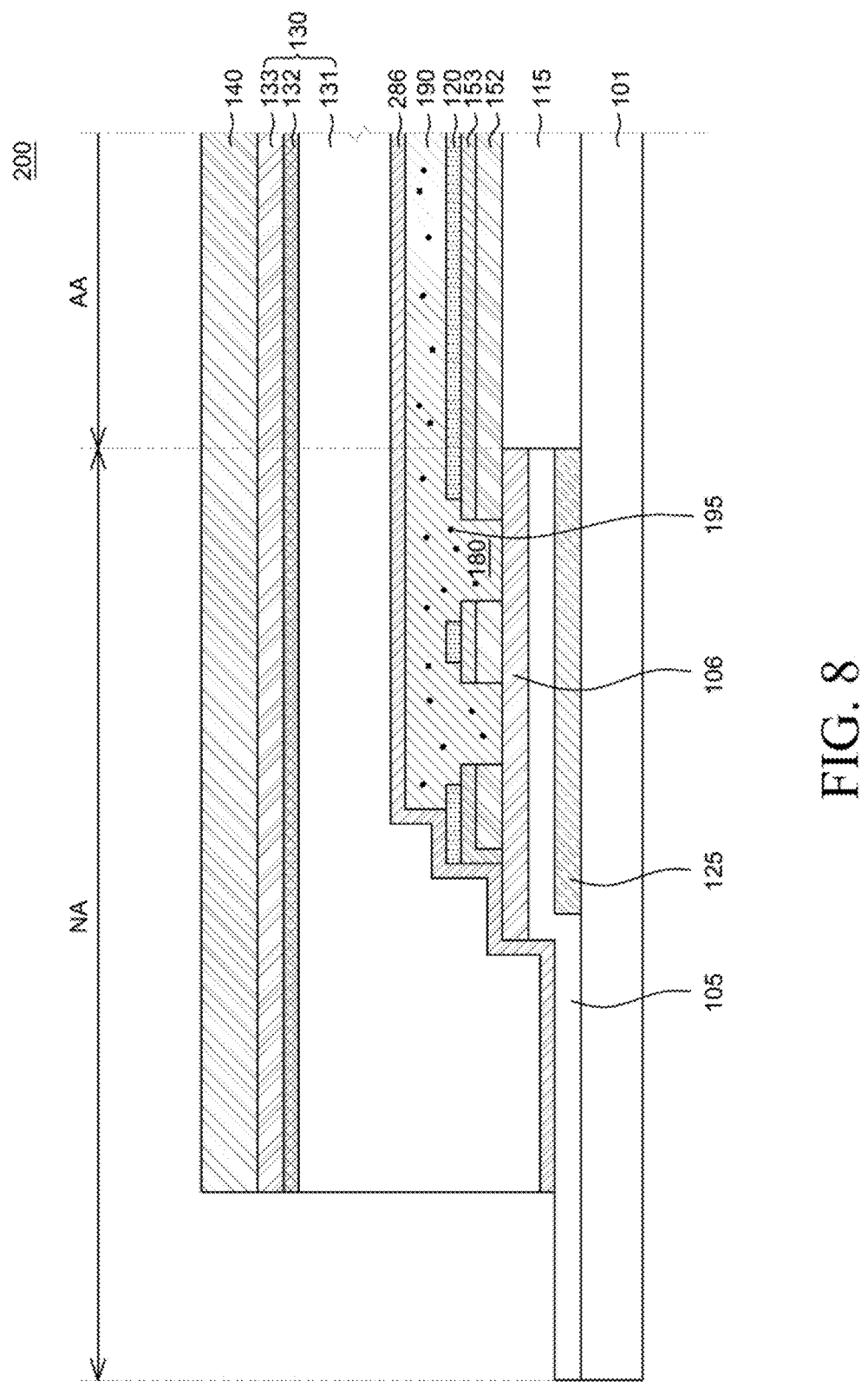
FIG. 8 is a cross-sectional view showing a display panel according to some aspects of the present disclosure.

FIG. 8 is a cross-sectional view showing a display panel according to some aspects of the present disclosure.

Since other configurations of a display panel 200 according to a second exemplary embodiment of the present disclosure in FIG. 8 are substantially identical to those of the display panel 100 according to the first exemplary embodiment of FIG. 3 with only a difference in configuration of an inorganic layer 286, the identical configurations will not be further described with reference to FIG. 8, for sake of brevity.

Referring to FIG. 8, in the display panel 200 according to the second exemplary embodiment aspect of the present disclosure, the pixel unit 115 and the GIP unit 125 may be disposed on the substrate 101.

In addition, the planarization layer 105 may be disposed on the GIP unit 125.

In addition, an organic light emitting element may be disposed on the planarization layer 105, and the capping layer 120, the step alleviation layer 190, and the inorganic layer 286 may be disposed on the organic light emitting element.

In addition, the sealing member 130 and the reinforcement substrate 140 may be sequentially disposed on the inorganic layer 286, but the present disclosure is not limited thereto. An encapsulation substrate may be disposed on the inorganic layer 286 with an adhesive layer interposed therebetween.

However, the display panel 200 according to the second exemplary embodiment of the present disclosure is not limited to such a laminated structure.

The planarization layer 105 may extend to the non-active area NA to cover the GIP unit 125.

The organic light emitting element may include an anode formed on the planarization layer 105, the organic layer 152 formed on the anode, and the cathode 153 formed on the organic layer 152.

The bank 106 may be disposed on the planarization layer 105 in the area other than the light emitting area.

The bank 106 may extend to the non-active area NA.

That is, the bank 106 may extend to a portion of the non-active area NA to be spaced apart from the end portion of the substrate 101 by a predetermined distance.

The bank 106 may cover the upper portion of the GIP unit 125, but is not limited thereto.

The organic layer 152 may be disposed on the anode exposed by the bank 106.

The organic layer 152 may extend to the non-active area NA.

The organic layer 152 may extend to a portion of the non-active area NA to be spaced apart from the end portion of the bank 106 by a predetermined distance.

In the non-active area NA, the organic layer 152 may be disposed on the bank 106.

The cathode 153 may be disposed on the organic layer 152.

The cathode 153 may extend to the non-active area NA.

The cathode 153 may be spaced apart from the end portion of the bank 106 by a predetermined distance and contact a portion of the upper surface of the bank 106.

In the non-active area NA, the cathode 153 may be disposed to cover the side surface of the organic layer 152. The organic layer 152 may be spaced apart from the end portion of the cathode 153 by a predetermined distance, but is not limited thereto.

The capping layer 120 may be disposed on the cathode 153.

The capping layer 120 may extend to the non-active area NA. In the non-active area NA, the capping layer 120 may be disposed on the cathode 153.

As described above, the display panel 200 according to the second exemplary aspect of the present disclosure is characterized in that the trench pattern 180 is formed by removing portions of the capping layer 120, the cathode 153, and the organic layer 152 in the non-active area NA. The trench pattern 180 may be disposed in a shadow area between end portions of the cathodes 153 in the non-active area NA outside the active area AA.

In addition, the display panel 200 according to the second exemplary aspect of the present disclosure is characterized in that the capping layer 120 adjacent to the trench pattern 180 is removed to be recessed inwardly more than the cathode 153.

In addition, a portion of the cathode 153 adjacent to the trench pattern 180 may be spaced apart from the organic layer 152.

In the case of the second exemplary aspect of the present disclosure, as the trench pattern 180 is formed in the non-active area NA, in the same manner as the first exemplary aspect described above, the cathode 153 of the active area AA and the cathode 153 of the non-active area NA may be disconnected from each other.

The step alleviation layer 190 may be disposed on the capping layer 120 as well as the trench pattern 180. The step alleviation layer 190 may be disposed to fill the inner portion of the trench pattern 180.

The step alleviation layer 190 may be formed of an organic material and may include a resin and the getters 195 dispersed in the resin.

The step alleviation layer 190 may be implemented in the form of a film.

The inorganic layer 286 formed of an inorganic insulating material may be disposed on the step alleviation layer 190.

The inorganic layer 286 according to the second exemplary aspect of the present disclosure may be disposed to be in contact with the upper surface of the step alleviation layer 190 and the other portion of the upper surface of the capping layer 120. That is, the inorganic layer 286 may cover the upper and side surfaces of the step alleviation layer 190 to encapsulate the step alleviation layer 190. In addition, the inorganic layer 286 according to the second exemplary aspect of the present disclosure extends to ends of the sealing member 130 and the reinforcement substrate 140 and may cover the side surface and the other portion of the upper surface of the capping layer 120 and the side surface of the cathode 153 disposed outside the outermost trench pattern

180, which are not completely covered by the step alleviation layer 190. In addition, the inorganic layer 286 according to the second exemplary aspect of the present disclosure may also cover a side surface and a portion of the upper surface of the bank 106 extending to the non-active area NA and a portion of an upper surface of the planarization layer 105.

That is, the inorganic layer 286 may contact the side surface and the portion of the upper surface of the bank 106 and the portion of the upper surface of the planarization layer 105. In addition, the inorganic layer 286 may extend to the ends of the sealing member 130 and the reinforcement substrate 140 so that a side surface thereof is exposed.

In this manner, as the inorganic layer 286 extends to cover a portion of the upper surface and the side surface of the bank 106 extending to the non-active area NA and a portion of the upper surface of the planarization layer 105, it is possible to effectively block oxygen penetration and moisture permeation at a side surface of the display panel 200.

Meanwhile, the step alleviation layer of the present disclosure may be extended in the non-active area to completely cover the capping layer and the cathode, which will be described in detail with reference to FIG. 9 below.

Figure 9:
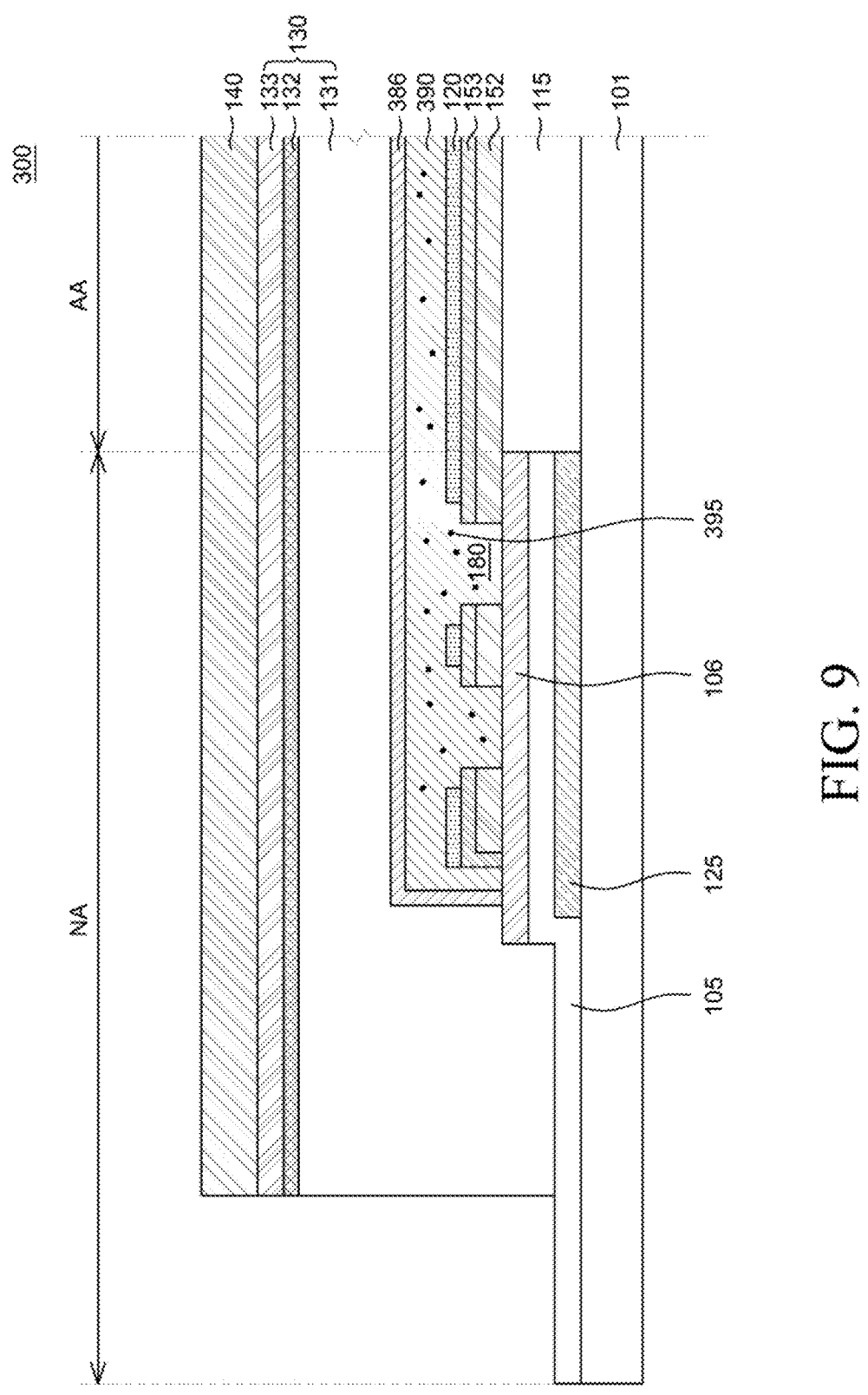
FIG. 9 is a cross-sectional view showing a display panel according to some aspects of the present disclosure.

FIG. 9 is a cross-sectional view showing a display panel according to some aspects of the present disclosure.

Since other configurations of a display panel 300 according to a third exemplary aspect of the present disclosure in FIG. 9 are substantially identical to those of the display panel 100 according to the first exemplary aspect of FIG. 3 with only differences in configurations of a step alleviation layer 390 and an inorganic layer 386, the identical configurations will not be further described with reference to FIG. 9, for sake of brevity.

Referring to FIG. 9, the display panel 300 of the third exemplary aspect of the present disclosure is characterized in that the trench pattern 180 is formed by selectively removing portions of the capping layer 120, the cathode 153, and the organic layer 152 in the non-active area NA, in the same manner as the first and second exemplary embodiments of the present disclosure.

In addition, the display panel 300 according to the third exemplary aspect of the present disclosure is characterized in that the capping layer 120 adjacent to the trench pattern 180 is removed to be recessed inwardly more than cathode 153.

In addition, a portion of the cathode 153 adjacent to the trench pattern 180 may be spaced apart from the organic layer 152.

In the case of the third exemplary aspect of the present disclosure, the step alleviation layer 390 may be disposed on the capping layer 120 as well as the inner portion of the trench pattern 180 in the same manner as the first and second exemplary embodiments described above. The step alleviation layer 390 may be disposed to fill the inner portion of the trench pattern 180. In particular, the step alleviation layer 390 according to the third exemplary aspect of the present disclosure is characterized in that it is formed to extend to the non-active area NA to completely cover the capping layer 120 and the cathode 153. The step alleviation layer 390 completely covers the capping layer 120 and the cathode 153 disposed outside the outermost trench pattern 180, while contacting a portion of the upper surface of the bank 106 that extends outwardly of the capping layer 120 and the cathode 153.

As the step alleviation layer 190 extends to completely cover the side surfaces of the capping layer 120 and the cathode 153 disposed outside the outermost trench pattern 180, it is possible to effectively block oxygen penetration and moisture permeation at a side surface of the display panel 300.

The step alleviation layer 390 may be formed of an organic material and may include a resin and getters 395 dispersed in the resin.

The step alleviation layer 390 may be implemented in the form of a film, and an upper surface thereof may be planarized.

The inorganic layer 386 formed of an inorganic insulating material may be disposed on the step alleviation layer 390.

The inorganic layer 386 according to the third exemplary aspect of the present disclosure may be disposed to be in contact with the upper surface and a side surface of the step alleviation layer 390 and a portion of the upper surface of the bank 106. That is, the inorganic layer 386 may cover the upper and side surfaces of the step alleviation layer 390 to encapsulate the step alleviation layer 390. In addition, the inorganic layer 386 may contact the portion of the upper surface of the bank 106.

Meanwhile, the step alleviation layer of the present disclosure may be formed to extend to the non-active area to completely cover the bank, which will be described in detail with reference to FIG. 10 below.

Figure 10:
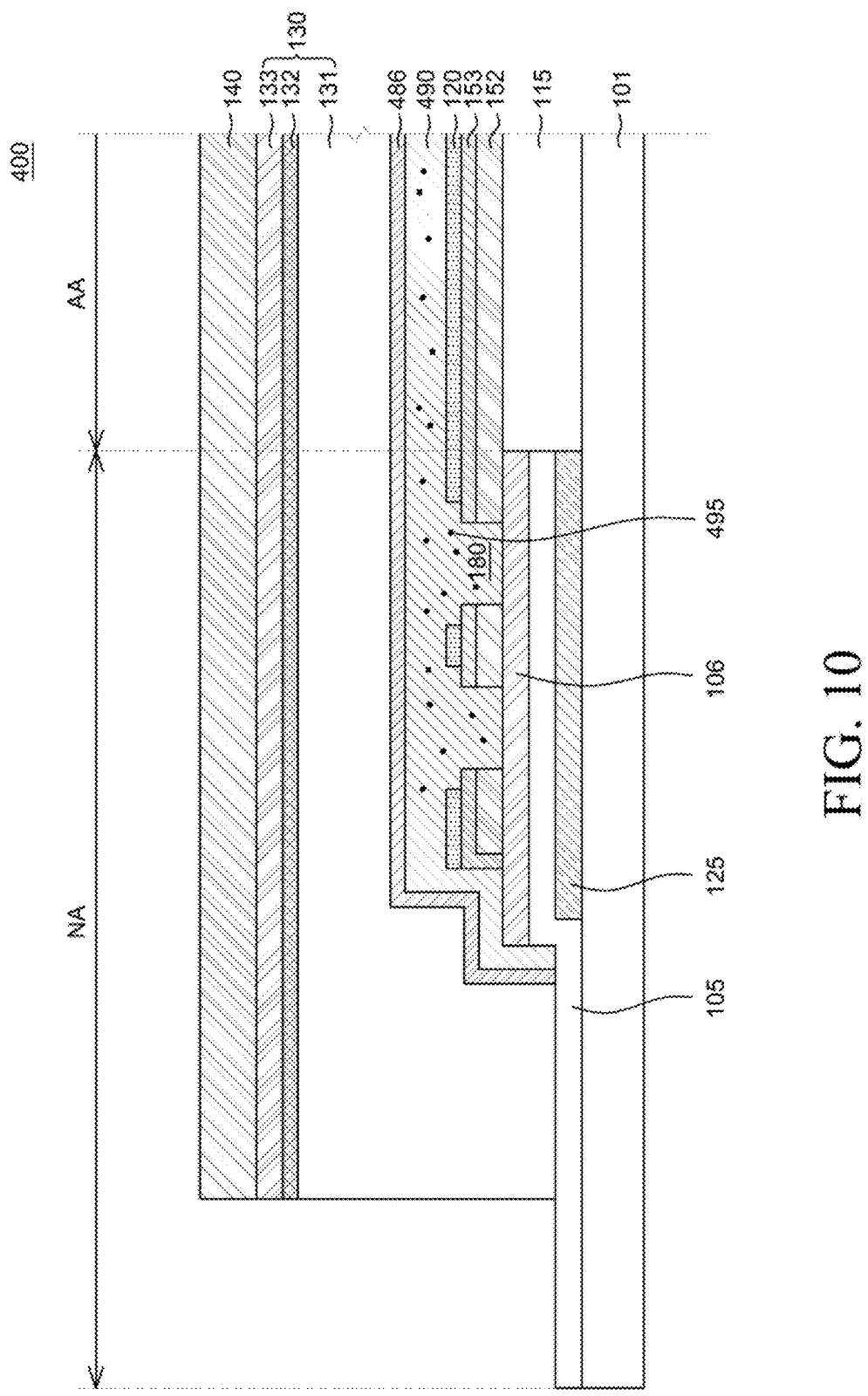
FIG. 10 is a cross-sectional view showing a display panel according to some aspects of the present disclosure.

FIG. 10 is a cross-sectional view showing a display panel according to a some aspects of the present disclosure.

Since other configurations of a display panel 400 according to a fourth exemplary aspect of FIG. 10 are substantially identical to those of the display panel 100 according to the first exemplary aspect of FIG. 3 with only differences in configurations of a step alleviation layer 490 and an inorganic layer 486, the identical configurations will not be further described with reference to FIG. 10, for sake of brevity.

Referring to FIG. 10, the display panel 400 according to the fourth exemplary aspect of the present disclosure is characterized in that the trench pattern 180 is formed by selectively removing portions of the capping layer 120, the cathode 153, and the organic layer 152 in the non-active area NA.

In addition, the display panel 400 according to the fourth exemplary aspect of the present disclosure is characterized in that the capping layer 120 adjacent to the trench pattern 180 is removed to be recessed inwardly more than the cathode 153.

In addition, a portion of the cathode 153 adjacent to the trench pattern 180 may be spaced apart from the organic layer 152.

In the fourth exemplary aspect of the present disclosure, the step alleviation layer 490 may be disposed on the capping layer 120 as well as the inner portion of the trench pattern 180 as in the same manner as the first to third exemplary embodiments described above. The step alleviation layer 490 may be disposed to fill the inner portion of the trench pattern 180. In particular, the step alleviation layer 490 according to the fourth exemplary aspect of the present disclosure extends to the non-active area NA to completely cover the capping layer 120, the cathode 153, and the bank 106. The step alleviation layer 490 completely covers the capping layer 120, the cathode 153, and the bank 106 that are disposed outside the outermost trench pattern 180, while contacting a portion of the upper surface of the planarization layer 105 extending outwardly of the bank 106.

In this manner, as the step alleviation layer 490 extends to completely cover the side surfaces of the capping layer 120, the cathode 153, and the bank 106 disposed outside the outermost trench pattern 180, it is possible to effectively block oxygen penetration and moisture permeation at a side surface of the display panel 400.

The step alleviation layer 490 may be formed of an organic material and may include a resin and getters 495 dispersed in the resin.

The step alleviation layer 490 may be implemented in the form of a film, and an upper surface thereof may be planarized.

The inorganic layer 486 formed of an inorganic insulating material may be disposed on the step alleviation layer 490.

The inorganic layer 486 according to the fourth exemplary aspect of the present disclosure may be disposed in contact with the upper and side surfaces of the step alleviation layer 490 and a portion of the upper surface of the planarization layer 105. That is, the inorganic layer 486 according to the fourth exemplary aspect of the present disclosure may cover the upper surface and the side surface of the step alleviation layer 490 to encapsulate the step alleviation layer 490. In addition, the inorganic layer 486 may contact a portion of the upper surface of the planarization layer 105.

Meanwhile, the inorganic layer of the present disclosure may be extended to the non-active area, which will be described in detail with reference to FIG. 11 below.

Figure 11:
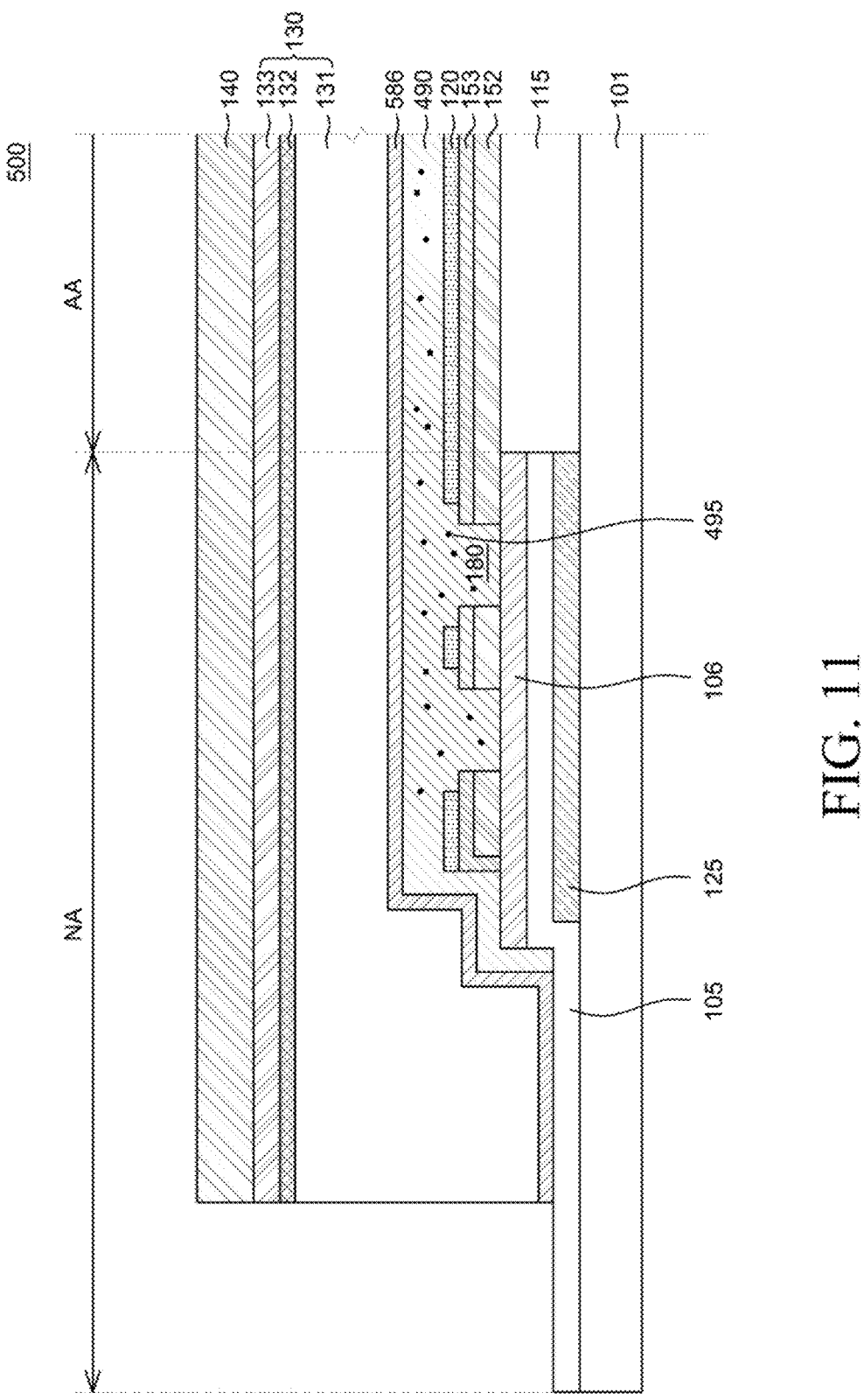
FIG. 11 is a cross-sectional view showing a display panel according to some aspects of the present disclosure.

FIG. 11 is a cross-sectional view showing a display panel according to some aspects of the present disclosure.

Since other configurations of a display panel 500 according to the fifth exemplary aspect of the present disclosure shown in FIG. 11 are substantially identical to those of the display panel 400 according to the fourth exemplary aspect shown in FIG. 10 with only a difference in configuration of an inorganic layer 586, the identical configurations will not be further described with reference to FIG. 11, for sake of brevity.

Referring to FIG. 11, the display panel 500 according to the fifth exemplary aspect of the present disclosure is characterized in that the trench pattern 180 is formed by removing portions of the capping layer 120, the cathode 153, and the organic layer 152 in the non-active area NA, in the same manner as the fifth exemplary aspect of the present disclosure described above.

In addition, the display panel 500 according to the fifth exemplary aspect of the present disclosure is characterized in that the capping layer 120 adjacent to the trench pattern 180 is removed to be recessed inwardly more than the cathode 153.

In addition, a portion of the cathode 153 adjacent to the trench pattern 180 may be spaced apart from the organic layer 152.

In the fifth exemplary aspect of the present disclosure, the step alleviation layer 490 may be disposed on the capping layer 120 as well as the inner portion of the trench pattern 180 in the same manner the fourth exemplary aspect described above.

The inorganic layer 586 formed of an inorganic insulating material may be disposed on the step alleviation layer 490.

The inorganic layer 586 according to the fifth exemplary aspect of the present disclosure may be disposed in contact with the upper and side surfaces of the step alleviation layer 490 and a portion of the upper surface of the planarization layer 105. That is, the inorganic layer 586 according to the fifth exemplary aspect of the present disclosure may cover the upper and side surfaces of the step alleviation layer 490 to encapsulate the step alleviation layer 490. In addition, the inorganic layer 586 according to the fifth exemplary aspect of the present disclosure extends to the ends of the sealing member 130 and the reinforcement substrate 140 and may cover a portion of the upper surface of the planarization layer 105 extending to the non-active area NA.

That is, the inorganic layer 586 may extend to the ends of the sealing member 130 and the reinforcement substrate 140 so that a side surface thereof is exposed.

In this manner, the inorganic layer 586 extends to cover a portion of the upper surface of the planarization layer 105 extending to the non-active area NA, it is possible to effectively block oxygen penetration and moisture permeation at a side surface of the display panel 500.

The exemplary embodiments of the present disclosure may also be described as follows:

According to an aspect of the present disclosure, there is provided an electroluminescent display device. The electroluminescent display device comprises a substrate including an active area and a non-active area outside the active area, a planarization layer over the substrate and extending from the active area to the non-active area, a bank on a planarization layer extending to the non-active area, an organic layer on the bank, a cathode on the organic layer, a capping layer over the cathode, a trench pattern configured in the non-active area, from which the capping layer, the cathode, and the organic layer are removed and a step alleviation layer filling the trench pattern and planarizing an upper portion of the trench pattern, the capping layer adjacent to the trench pattern may be recessed inwardly compared to the cathode.

The step alleviation layer may be implemented as a film.

The step alleviation layer may include getters.

The cathode disposed outside the trench pattern may cover a side surface of the organic layer.

The electroluminescent display device may further include an inorganic layer on the step alleviation layer.

The step alleviation layer may be disposed in contact with a portion of an upper surface of the capping layer disposed outside the trench pattern.

The inorganic layer may be disposed in contact with an upper surface and a side surface of the step alleviation layer, the other portion of the upper surface of the capping layer, and a portion of an upper surface of the bank.

The inorganic layer may be disposed in contact with a portion of an upper surface and a side surface of the bank and a portion of an upper surface of the planarization layer.

The step alleviation layer may cover the capping layer and the cathode disposed outside the trench pattern, and may be disposed in contact with a portion of an upper surface of the bank extending outwardly of the capping layer and the cathode.

The inorganic layer may be disposed in contact with an upper surface and a side surface of the step alleviation layer and another portion of the upper surface of the bank.

The step alleviation layer may cover the capping layer, the cathode, and the bank disposed outside the trench pattern, while contacting a portion of an upper surface of the planarization layer extending outwardly of the bank.

The inorganic layer may be disposed in contact with an upper surface and a side surface of the step alleviation layer and another portion of the upper surface of the planarization layer.

The inorganic layer may extend to the non-active area to expose a side surface thereof.

An end portion of the cathode disposed adjacent to the trench pattern may have a shape that is lifted or rolled upward.

The end portion of the cathode may be spaced apart from the organic layer.

The step alleviation layer may fill a separation space between the cathode and the organic layer.

The electroluminescent display device may further include a reinforcement substrate and a sealing member having a multilayer structure, disposed on the inorganic layer.

The sealing member may include a first adhesive layer on the step alleviation layer and facing the substrate, a second adhesive layer facing the reinforcement substrate and a barrier layer between the first adhesive layer and the second adhesive layer.

The inorganic layer may extend to ends of the sealing member and the reinforcement substrate.

A side surface of the inorganic layer may be exposed.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

What is claimed is:

1. An electroluminescent display device, comprising:
a substrate including an active area and a non-active area outside the active area;
a planarization layer over the substrate and extending from the active area to the non-active area;
a bank on the planarization layer extending to the non-active area;
an organic layer on the bank;
a cathode on the organic layer;
a capping layer over the cathode;
a trench pattern configured in the non-active area, from which the capping layer, the cathode, and the organic layer are removed;
a step alleviation layer filling the trench pattern and planarizing an upper portion of the trench pattern;
an inorganic layer on the step alleviation layer; and
a reinforcement substrate and a sealing member having a multilayer structure, disposed on the inorganic layer,
wherein the capping layer adjacent to the trench pattern is recessed inwardly compared to the cathode.

2. The electroluminescent display device of claim 1, wherein the step alleviation layer is implemented as a film.

3. The electroluminescent display device of claim 1, wherein the step alleviation layer includes getters.

4. The electroluminescent display device of claim 1, wherein the cathode disposed outside the trench pattern covers a side surface of the organic layer.

5. The electroluminescent display device of claim 1, wherein the step alleviation layer is disposed in contact with a portion of an upper surface of the capping layer disposed outside the trench pattern.

6. The electroluminescent display device of claim 5, wherein the inorganic layer is disposed in contact with an upper surface and a side surface of the step alleviation layer, a portion of the upper surface of the capping layer, and a portion of an upper surface of the bank.

7. The electroluminescent display device of claim 5, wherein the inorganic layer is disposed in contact with a portion of an upper surface and a side surface of the bank and a portion of an upper surface of the planarization layer.

8. The electroluminescent display device of claim 1, wherein the step alleviation layer covers the capping layer and the cathode disposed outside the trench pattern, and is disposed in contact with a portion of an upper surface of the bank extending outwardly of the capping layer and the cathode.

9. The electroluminescent display device of claim 8, wherein the inorganic layer is disposed in contact with an upper surface and a side surface of the step alleviation layer and another portion of the upper surface of the bank.

10. The electroluminescent display device of claim 1, wherein the step alleviation layer covers the capping layer, the cathode, and the bank disposed outside the trench pattern, while contacting a portion of an upper surface of the planarization layer extending outwardly of the bank.

11. The electroluminescent display device of claim 10, wherein the inorganic layer is disposed in contact with an upper surface and a side surface of the step alleviation layer and another portion of the upper surface of the planarization layer.

12. The electroluminescent display device of claim 11, wherein the inorganic layer extends to the non-active area to expose a side surface thereof.

13. The electroluminescent display device of claim 1, wherein an end portion of the cathode disposed adjacent to the trench pattern has a shape that is lifted or rolled upward.

14. The electroluminescent display device of claim 13, wherein the end portion of the cathode is spaced apart from the organic layer.

15. The electroluminescent display device of claim 14, wherein the step alleviation layer fills a separation space between the cathode and the organic layer.

16. The electroluminescent display device of claim 1, wherein the sealing member includes,
  a first adhesive layer on the step alleviation layer and facing the substrate;
  a second adhesive layer facing the reinforcement substrate; and a barrier layer between the first adhesive layer and the second adhesive layer.

17. The electroluminescent display device of claim 1, wherein the inorganic layer extends to ends of the sealing member and the reinforcement substrate.

18. The electroluminescent display device of claim 17, wherein a side surface of the inorganic layer is exposed.

19. An electroluminescent display device, comprising:
  a substrate including an active area and a non-active area outside the active area;
  a planarization layer over the substrate and extending from the active area to the non-active area;
  a bank on the planarization layer;
  an organic layer on the bank;
  a cathode on the organic layer;
  a capping layer over the cathode;
  a trench pattern configured in the non-active area, from which the capping layer, the cathode, and the organic layer are removed;
  a step alleviation layer filling the trench pattern;
  an inorganic layer that covers the step alleviation layer; and
  a sealing member having two ends,
  wherein the capping layer adjacent to the trench pattern is recessed inwardly compared to the cathode, and
  wherein the inorganic layer extends from one of the two ends to another one of the two ends and covers the bank and the sealing member.

20. The electroluminescent display device of claim 19, wherein the step alleviation layer engulfs the capping layer and the cathode.

21. The electroluminescent display device of claim 19, wherein the step alleviation layer engulfs the capping layer, the cathode, a bank on the planarization layer, and the planarization layer.

22. The electroluminescent display device of claim 21, wherein the inorganic layer extends to cover the bank between the two ends of the sealing member.

23. An electroluminescent display device, comprising:
  a substrate including an active area and a non-active area outside the active area;
  a planarization layer over the substrate and extending from the active area to the non-active area;
  a bank on the planarization layer extending to the non-active area;
  an organic layer on the bank;
  a cathode on the organic layer;
  a capping layer over the cathode;
  a trench pattern configured in the non-active area, from which the capping layer, the cathode, and the organic layer are removed; and
  a step alleviation layer filling the trench pattern and planarizing an upper portion of the trench pattern,
  wherein the capping layer adjacent to the trench pattern is recessed inwardly compared to the cathode, and
  wherein an end portion of the cathode disposed adjacent to the trench pattern has a shape that is lifted or rolled upward.

* * * * *